United States Patent
Li et al.

(10) Patent No.: US 11,263,943 B2
(45) Date of Patent: Mar. 1, 2022

(54) SHIFT REGISTER AND DRIVING METHOD THEREFOR, GATE DRIVE CIRCUIT, AND DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Meng Li, Beijing (CN); Yongqian Li, Beijing (CN); Zhidong Yuan, Beijing (CN); Can Yuan, Beijing (CN)

(73) Assignees: Hefei Xinsheng Optoelectronics Technology Co., Ltd., Hefei (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/652,589

(22) PCT Filed: May 31, 2019

(86) PCT No.: PCT/CN2019/089677
§ 371 (c)(1),
(2) Date: Mar. 31, 2020

(87) PCT Pub. No.: WO2019/237956
PCT Pub. Date: Dec. 19, 2019

(65) Prior Publication Data
US 2020/0234623 A1    Jul. 23, 2020

(30) Foreign Application Priority Data
Jun. 11, 2018  (CN) .......................... 201810597266.7

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0286* (2013.01); *G09G 2320/02* (2013.01)

(58) Field of Classification Search
CPC ................. G09G 3/20; G09G 2310/08; G09G 2310/0267; G09G 2354/00;
(Continued)

(56) References Cited

U.S. PATENT DOCUMENTS

| 10,332,470 B2* | 6/2019 | Feng ....................... G11C 19/28 |
| 2008/0054957 A1* | 3/2008 | Takeda ...................... G06F 1/10 327/143 |

(Continued)

FOREIGN PATENT DOCUMENTS

| CN | 102956213 A | 3/2013 |
| CN | 103489483 A | 1/2014 |

(Continued)

OTHER PUBLICATIONS

Office Action for corresponding Chinese Application 201810597266.7 dated Nov. 25, 2019.
(Continued)

*Primary Examiner* — Olga V Merkoulova
(74) *Attorney, Agent, or Firm* — Arent Fox LLP; Michael Fainberg

(57) ABSTRACT

The present disclosure discloses a shift register and a driving method therefor, a gate drive circuit, and a display device. An input circuit is configured to respond to a signal of an input signal end and provide a signal of a first reference signal terminal to a first node; a reset circuit is configured to respond to the signal of the second node and provide a signal of a second reference signal end to the first node; and an output circuit is configured to respond to the signal of the first node and provide the signal of the clock signal end to
(Continued)

an output signal end and is configured to respond to the signal of the third node and provide the signal of the second reference signal end to the output signal end.

9 Claims, 12 Drawing Sheets

(58) Field of Classification Search
CPC .......... G09G 2310/027; G09G 3/3225; G09G 3/3233; G09G 2300/0408; G09G 2330/021
See application file for complete search history.

(56) References Cited

U.S. PATENT DOCUMENTS

| | | | | |
|---|---|---|---|---|
| 2009/0323442 | A1* | 12/2009 | Song | G11C 8/18 365/191 |
| 2010/0141641 | A1* | 6/2010 | Furuta | G11C 19/184 345/213 |
| 2011/0274213 | A1* | 11/2011 | Kasai | B41J 2/07 375/316 |
| 2013/0265291 | A1* | 10/2013 | Huang | G11C 19/28 345/212 |
| 2014/0354655 | A1* | 12/2014 | Kim | G11C 19/28 345/501 |
| 2015/0043703 | A1* | 2/2015 | Tan | G11C 19/184 377/68 |
| 2015/0243367 | A1 | 8/2015 | Gu et al. | |
| 2015/0317954 | A1* | 11/2015 | Jang | G09G 5/18 345/213 |
| 2016/0064098 | A1* | 3/2016 | Han | G09G 3/3225 345/211 |
| 2016/0172054 | A1 | 6/2016 | Shao et al. | |
| 2016/0253976 | A1* | 9/2016 | Jang | G09G 3/3677 345/208 |
| 2016/0267854 | A1* | 9/2016 | Kim | G09G 3/3466 |
| 2016/0372070 | A1 | 12/2016 | Hu et al. | |
| 2017/0039950 | A1 | 2/2017 | Li et al. | |
| 2017/0213499 | A1* | 7/2017 | Kong | G11C 19/28 |
| 2018/0061353 | A1* | 3/2018 | Takeuchi | G11C 19/28 |
| 2018/0068631 | A1* | 3/2018 | Abe | G09G 3/20 |
| 2018/0090090 | A1* | 3/2018 | Feng | G09G 3/3674 |
| 2018/0286302 | A1 | 10/2018 | Feng | |
| 2020/0234623 | A1 | 7/2020 | Li et al. | |

FOREIGN PATENT DOCUMENTS

| | | |
|---|---|---|
| CN | 104392704 A | 3/2015 |
| CN | 104575436 A | 4/2015 |
| CN | 104992663 A | 10/2015 |
| CN | 105913793 A | 8/2016 |
| CN | 205564249 A | 9/2016 |
| CN | 106157923 A | 11/2016 |
| CN | 106228927 A | 12/2016 |
| CN | 106898287 A | 6/2017 |
| CN | 106935206 A | 7/2017 |
| CN | 107403609 A | 11/2017 |
| CN | 108470535 A | 8/2018 |
| JP | 2010086640 A | 4/2010 |

OTHER PUBLICATIONS

Office Action for corresponding Chinese Application 201810597266.7 dated Apr. 14, 2020.

Decision of Rejection for corresponding Chinese Application 201810597266.7 dated Jul. 31, 2020.

* cited by examiner in a first phase, providing, by the input circuit, the signal of the first reference signal terminal to the first node in response to the signal of the input signal terminal; controlling, by the first control circuit, the signal of the second node in response to the signal of the input signal terminal; controlling, by the second control circuit, the signal of the third node in response to the signal of the first node; and providing, by the output circuit, the signal of the clock signal terminal to the output signal terminal in response to the signal of the first node ⎯301 providing, by the output circuit, the signal of the clock signal terminal to the output signal terminal in response to the signal of the first node; controlling, by the first control circuit, the signal of the second node in response to the signal of the clock signal terminal; and controlling, by the second control circuit, the signal of the third node in response to the signal of the first node ⎯302 providing, by the output circuit, the signal of the clock signal terminal to the output signal terminal in response to the signal of the first node, and providing the signal of the second reference signal terminal to the output signal terminal in response to the signal of the third node ⎯303

Fig. 3

SHIFT REGISTER AND DRIVING METHOD THEREFOR, GATE DRIVE CIRCUIT, AND DISPLAY DEVICE

This application is a US National Stage of International Application No. PCT/CN2019/089677, filed on May 31, 2019, which claims priority to Chinese patent application No. 201810597266.7, filed with Chinese Patent Office on Jun. 11, 2018, entitled "Shift Register and Driving Method Therefor, Gate Drive Circuit, and Display Device", which is incorporated herein by reference in its entirety.

FIELD

The present disclosure relates to the technical field of display, and in particular, to a shift register and a driving method therefor, a gate drive circuit, and a display device.

BACKGROUND

In recent years, with the vigorous development of the display field, the cost requirements for display panels have become increasingly lower, and how to effectively reduce the manufacturing cost of the panels influences the competitiveness of panel developers. To reduce the manufacturing cost of a display panel, the skilled in the art can design a gate drive circuit (gate-driver on array, GOA) by using edges of the display panel. Specifically, shift registers are integrated on an array substrate, and in a display stage, each row of shift registers drives pixels in the row to perform display. As the GOA can be implemented in the same manufacturing process as the array substrate, the manufacturing cost is saved. Moreover, compared with traditional chip on film (COF) and chip on glass (COG) processes, a GOA technology improves the integration of the display panel and meets the narrow-border design requirement at present.

SUMMARY

An embodiment of the present disclosure provides a shift register, including:

an input circuit, configured to provide a signal of a first reference signal terminal to a first node in response to a signal of an input signal terminal;

a first control circuit, configured to control a signal of a second node in response to signals of the input signal terminal, a clock signal terminal and a second control clock signal terminal;

a reset circuit, configured to provide a signal of a second reference signal terminal to the first node in response to the signal of the second node;

a second control circuit, configured to control a signal of a third node in response to signals of a first control clock signal terminal, the second control clock signal terminal, and the first node; and an output circuit, configured to provide the signal of the clock signal terminal to an output signal terminal in response to the signal of the first node, and configured to provide the signal of the second reference signal terminal to the output signal terminal in response to the signal of the third node.

Optionally, in an embodiment of the present disclosure, the shift register further includes:

a reset control circuit, configured to provide the signal of the second reference signal terminal to the first node and the output signal terminal respectively in response to a signal of a reset signal terminal.

Optionally, in an embodiment of the present disclosure, the input circuit includes a first switching transistor; and a gate of the first switching transistor is coupled to the input signal terminal, a first electrode of the first switching transistor is coupled to the first reference signal terminal, and a second electrode of the first switching transistor is coupled to the first node.

Optionally, in an embodiment of the present disclosure, the output circuit includes: a second switching transistor, a sixth switching transistor and a capacitor;

a gate of the second switching transistor is coupled to the first node, a first electrode of the second switching transistor is coupled to the clock signal terminal, and a second electrode of the second switching transistor is coupled to the output signal terminal;

a gate of the sixth switching transistor is coupled to the third node, a first electrode of the sixth switching transistor is coupled to the second reference signal terminal, and a second electrode of the sixth switching transistor is coupled to the output signal terminal; and the capacitor is coupled between the first node and the output signal terminal.

Optionally, in an embodiment of the present disclosure, the second control circuit includes: a third switching transistor, a fourth switching transistor, and a fifth switching transistor;

a gate and a first electrode of the third switching transistor are coupled to the first control clock signal terminal respectively, and a second electrode of the third switching transistor is coupled to the third node;

a gate and a first electrode of the fourth switching transistor are coupled to the second control clock signal terminal respectively, and a second electrode of the fourth switching transistor is coupled to the third node;

a gate of the fifth switching transistor is coupled to the first node, a first electrode of the fifth switching transistor is coupled to a third reference signal terminal, and a second electrode of the fifth switching transistor is coupled to the third node; and a width-to-length ratio of the fifth switching transistor is greater than that of the third switching transistor and that of the fourth switching transistor.

Optionally, in an embodiment of the present disclosure, the reset circuit includes a seventh switching transistor; and a gate of the seventh switching transistor is coupled to the second node, a first electrode of the seventh switching transistor is coupled to the second reference signal terminal, and a second electrode of the seventh switching transistor is coupled to the first node.

Optionally, in an embodiment of the present disclosure, the first control circuit includes: an eighth switching transistor, a ninth switching transistor and a tenth switching transistor;

a gate and a first electrode of the eighth switching transistor are coupled to the second control clock signal terminal respectively, and a second electrode of the eighth switching transistor is coupled to the second node;

a gate of the ninth switching transistor is coupled to the input signal terminal, a first electrode of the ninth switching transistor is coupled to a third reference signal terminal, and a second electrode of the ninth switching transistor is coupled to the second node;

a gate of the tenth switching transistor is coupled to the clock signal terminal, a first electrode of the tenth switching transistor is coupled to the third reference signal terminal, and a second electrode of the tenth switching transistor is coupled to the second node; and a width-to-length ratio of the eighth switching transistor is smaller than that of the ninth switching transistor and that of the tenth switching transistor.

Optionally, in an embodiment of the present disclosure, the reset control circuit includes: an eleventh switching transistor and a twelfth switching transistor;

a gate of the eleventh switching transistor is coupled to the reset signal terminal, a first electrode of the eleventh switching transistor is coupled to the second reference signal terminal, and a second electrode of the eleventh switching transistor is coupled to the first node; and a gate of the twelfth switching transistor is coupled to the reset signal terminal, a first electrode of the twelfth switching transistor is coupled to the second reference signal terminal, and a second electrode of the twelfth switching transistor is coupled to the output signal terminal.

An embodiment of the present disclosure further provides a gate drive circuit, including a plurality of cascaded aforementioned shift registers, an input signal terminal of a first stage of shift register is coupled to a first frame trigger signal terminal;

an input signal terminal of a second stage of shift register is coupled to a second frame trigger signal terminal; and in every three adjacent stages of shift registers, an input signal terminal of a third shift register is coupled to an output signal terminal of a first shift register.

An embodiment of the present disclosure further provides a display device, including the aforementioned gate drive circuit.

An embodiment of the present disclosure further provides a driving method for the aforementioned shift register, including:

in a first phase: providing, by the input circuit, the signal of the first reference signal terminal to the first node in response to the signal of the input signal terminal; controlling, by the first control circuit, the signal of the second node in response to the signal of the input signal terminal; controlling, by the second control circuit, the signal of the third node in response to the signal of the first node; and providing, by the output circuit, the signal of the clock signal terminal to the output signal terminal in response to the signal of the first node;

in a second phase: providing, by the output circuit, the signal of the clock signal terminal to the output signal terminal in response to the signal of the first node; controlling, by the first control circuit, the signal of the second node in response to the signal of the clock signal terminal; and controlling, by the second control circuit, the signal of the third node in response to the signal of the first node; and in a third phase: providing, by the output circuit, the signal of the clock signal terminal to the output signal terminal in response to the signal of the first node, and providing the signal of the second reference signal terminal to the output signal terminal in response to the signal of the third node.

BRIEF DESCRIPTION OF THE DRAWINGS

FIG. 3 is a flow diagram of a driving method for the shift register shown in FIG. 2.

DETAILED DESCRIPTION OF THE EMBODIMENTS

Figure 1:
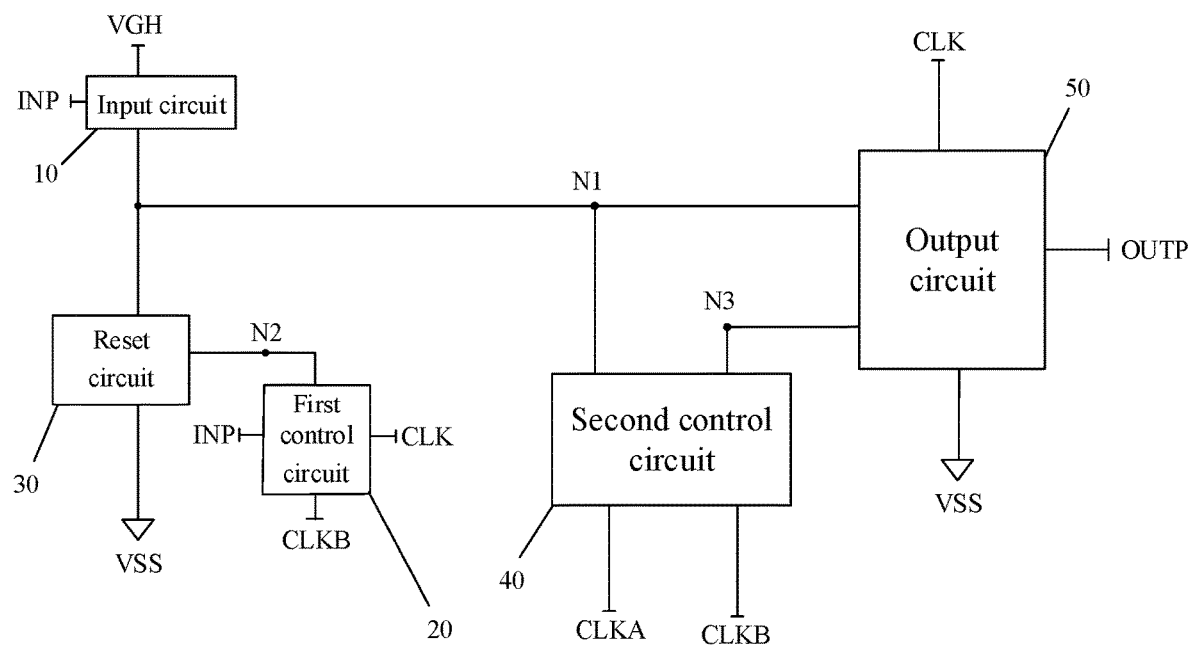
FIG. 1 is a structural schematic diagram of some shift registers provided in an embodiment of the present disclosure.

To make the objects, technical solutions and advantages of the embodiments of the present disclosure clearer, the technical solutions in the embodiments of the present disclosure will be described clearly and completely with reference to the drawings in the embodiments of the present disclosure. Obviously, the described embodiments are only a part of the embodiments of the present disclosure, and not all the embodiments. Based on the described embodiments of the present disclosure, all other embodiments obtained by those of ordinary skilled in the art without creative work shall fall into the protection scope of the present disclosure.

Unless otherwise defined, technical or scientific terms used in the present disclosure shall have the ordinary meanings understood by those of ordinary skilled in the art to which the present disclosure pertains. The terms "first", "second" and the like used in the present disclosure do not indicate any order, quantity or importance, but are only used to distinguish different components. Words such as "comprise" or "include" indicate that an element or item appearing before such the word covers listed elements or items appearing after the word and equivalents thereof, and does not exclude other elements or items. Words such as "connect" or "couple" are not limited to physical or mechanical connection, but may include electrical connection, whether direct or indirect.

It should be noted that sizes and shapes in the drawings do not reflect the true scale, and are merely intended to schematically illustrate the content of the present disclosure. Furthermore, the same or similar reference numerals throughout represent the same or similar elements or elements having the same or similar functions.

Generally, in a GOA technology, progressive scanning is performed on pixels. When a level signal of an output signal terminal of a prior-stage shift register is completely pulled down, a following-stage shift register coupled thereto starts to work. Thus, a speed at which a level signal of an output signal terminal of each shift register is pulled down has a great influence on the display quality.

Some shift registers provided in embodiments of the present disclosure, as shown in FIG. 1, include: an input circuit 10, a first control circuit 20, a reset circuit 30, a second control circuit 40, and an output circuit 50.

The input circuit 10 is configured to provide a signal of a first reference signal terminal VGH to a first node N1 in response to a signal of an input signal terminal INP, where the input circuit 10 is coupled to the input signal terminal INP, the first reference signal terminal VGH and the first node N1 respectively.

The first control circuit 20 is configured to control a signal of a second node N2 in response to signals of the input signal terminal INP, a clock signal terminal CLK, and a second control clock signal terminal CLKB, where the first control circuit 20 is coupled to the input signal terminal INP, the clock signal terminal CLK, the second control clock signal terminal CLKB and the second node N2 respectively.

The reset circuit 30 is configured to provide a signal of a second reference signal terminal VSS to the first node N1 in response to the signal of the second node N2, where the reset circuit 30 is couple to the second node N2, the second reference signal terminal VSS and the first node N1 respectively.

The second control circuit 40 is configured to control a signal of a third node N3 in response to signals of a first control clock signal terminal CLKA, the second control clock signal terminal CLKB, and the first node N1, where the second control circuit 40 is couple to the first control clock signal terminal CLKA, the second control clock signal terminal CLKB, the first node N1 and the third node N3 respectively.

The output circuit 50 is configured to provide the signal of the clock signal terminal CLK to an output signal terminal OUTP in response to the signal of the first node N1, and configured to provide the signal of the second reference signal terminal VSS to the output signal terminal OUTP in response to the signal of the third node N3, where the output circuit 50 is coupled to the first node N1, the clock signal terminal CLK, the output signal terminal OUTP, the third node N3, and the second reference signal terminal VSS respectively.

In the aforementioned shift register provided in the embodiment of the present disclosure, the output circuit 50 inputs the signal of the clock signal terminal CLK to the output signal terminal INP in response to the signal of the first node N1; meanwhile, the second control circuit 40 controls the signal of the third node N3 in response to the signal of the first control clock signal terminal CLKA; and the output circuit 50 provides the signal of the second reference signal terminal VSS to the output signal terminal OUTP in response to the signal of the third node N3. In this way, under the combined effect of the signal of the clock signal terminal CLK and the signal of the second reference signal terminal VSS, the output signal terminal OUTP outputs a signal. As a result, the pull-down time of the output signal terminal OUTP can be reduced, the charging rate of the pixels is increased, and the screen display abnormality is effectively improved.

Furthermore, the second control circuit 40 controls the signal of the third node N3 in response to the signals of the first control clock signal terminal CLKA, the second control clock signal terminal CLKB and the first node N1, and the output circuit 50 responds to the signal of the third node N3, which can prevent the signal of the second reference signal terminal VSS from pulling down the output signal terminal OUTP, thus ensuring the output stability.

In addition, the first control circuit 20 can control the signal of the second node N2 in response to the signal of the input signal terminal INP; or the first control circuit 20 controls the signal of the second node N2 in response to the signals of the clock signal terminal CLK and the second control clock signal terminal CLKB. Through the aforementioned control over the signal of the second node N2, the first node N1 can be prevented from electrical leakage through the reset circuit 30, thereby ensuring the stability of the level signal of the first node N1, thus ensuring the output stability.

The shift register provided in the embodiments of the present disclosure will be described in detail below with reference to a specific embodiment. Furthermore, the specific embodiment is intended to better explain the embodiments of the present disclosure, but does not limit the embodiments of the present disclosure.

Figure 2:
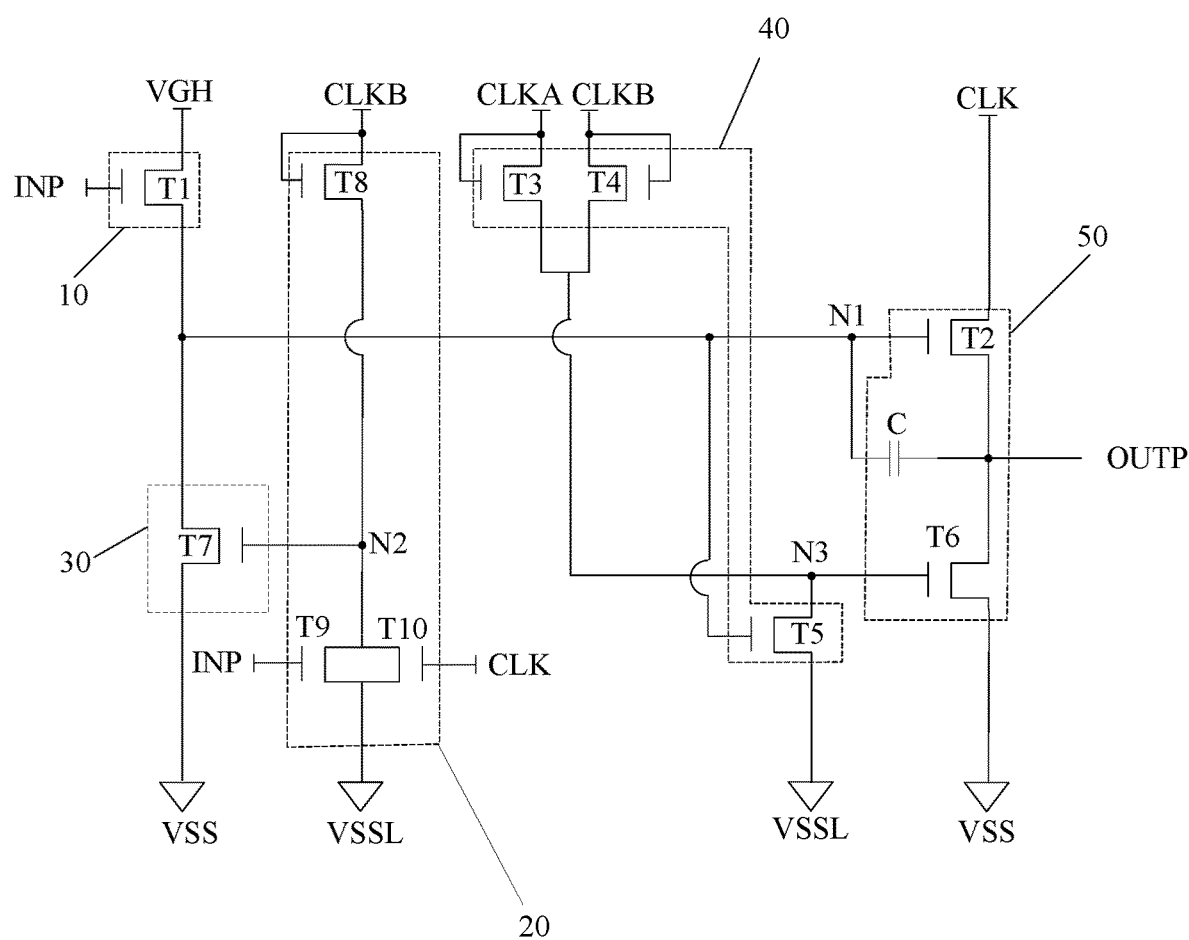
FIG. 2 is a schematic diagram of some specific structures of the shift register shown in FIG. 1.

In the shift register provided in the embodiment of the present disclosure, as shown in FIG. 2, the input circuit 10 can include a first switching transistor T1;

a gate of the first switching transistor T1 is coupled to the input signal terminal INP, a first electrode of the first switching transistor T1 is coupled to the first reference signal terminal VGH, and a second electrode of the first switching transistor T1 is coupled to the first node N1.

In specific implementation, in the embodiment of the present disclosure, as shown in FIG. 2, the output circuit 50 can include: a second switching transistor T2, a sixth switching transistor T6, and a capacitor C;

a gate of the second switching transistor T2 is coupled to the first node N1, a first electrode of the second switching transistor T2 is coupled to the clock signal terminal CLK, and a second electrode of the second switching transistor T2 is coupled to the output signal terminal OUTP; and a gate of the sixth switching transistor T6 is coupled to the third node N3, a first electrode of the sixth switching transistor T6 is coupled to the second reference signal terminal VSS, and a second electrode of the sixth switching transistor T6 is coupled to the output signal terminal OUTP.

In specific implementation, in the embodiment of the present disclosure, as shown in FIG. 2, the capacitor C is coupled between the first node N1 and the output signal terminal OUTP.

The second control circuit 40 can include: a third switching transistor T3, a fourth switching transistor T4, and a fifth switching transistor T5;

a gate and a first electrode of the third switching transistor T3 are coupled to the first control clock signal terminal CLKA, and a second electrode of the third switching transistor T3 is coupled to the third node N3;

a gate and a first electrode of the fourth switching transistor T4 are coupled to the second control clock signal terminal CLKB, and a second electrode of the fourth switching transistor T4 is coupled to the third node N3;

a gate of the fifth switching transistor T5 is coupled to the first node N1, a first electrode of the fifth switching transistor T5 is coupled to a third reference signal terminal VSSL, and a second electrode of the fifth switching transistor T5 is coupled to the third node N3; and a width-to-length ratio of the fifth switching transistor T5 is greater than that of the third switching transistor T3 and that of the fourth switching transistor T4.

In specific implementation, in the embodiment of the present disclosure, as shown in FIG. 2, the reset circuit 30 can include a seventh switching transistor T7, where a gate of the seventh switching transistor T7 is coupled to the second node N2, a first electrode of the seventh switching transistor T7 is coupled to the second reference signal terminal VSS, and a second electrode of the seventh switching transistor T7 is coupled to the first node N1.

In specific implementation, in the embodiment of the present disclosure, as shown in FIG. 2, the first control circuit 20 can include: an eighth switching transistor T8, a ninth switching transistor T9, and a tenth switching transistor T10;

a gate and a first electrode of the eighth switching transistor T8 are coupled to the second control clock signal terminal CLKB, and a second electrode of the eighth switching transistor T8 is coupled to the second node N2;

a gate of the ninth switching transistor T9 is coupled to the input signal terminal INP, a first electrode of the ninth switching transistor T9 is coupled to the third reference signal terminal VSSL, and a second electrode of the ninth switching transistor T9 is coupled to the second node N2;

a gate of the tenth switching transistor T10 is coupled to the clock signal terminal CLK, a first electrode of the tenth switching transistor T10 is coupled to the third reference signal terminal VSSL, and a second electrode of the tenth switching transistor T10 is coupled to the second node N2; and a width-to-length ratio of the eighth switching transistor T8 is smaller than that of the ninth switching transistor T9 and that of the tenth switching transistor T10.

Exemplarily described above are only specific structures of the circuits in the shift register provided in the embodiment of the present disclosure. In specific implementation, the specific structures of the circuits are not limited to the aforementioned structures provided in the specific embodiment of the present disclosure, and may further be other structures known to those skilled in the art, and are not limited herein.

In specific implementation, to ensure a unified manufacturing process, in the embodiment of the present disclosure, as shown in FIG. 2, all the switching transistors can be N-type transistors. It should be noted that the embodiment of the present disclosure is described merely by using an example in which the transistors in the shift register are the N-type transistors. In the case where the transistors are P-type transistors, the design principle is the same as that in the present disclosure, and it also falls within the protection scope of the present disclosure.

In specific implementation, in the embodiment of the present disclosure, when an effective pulse signal of the input signal terminal is a high-level signal, the signal of the first reference signal terminal is a high-level signal, the signal of the second reference signal terminal is a low-level signal, and the signal of the third reference signal terminal is a low-level signal. Exemplary, with reference to FIGS. 2 and 4, the high-level signal of the input signal terminal INP is used as its effective pulse signal to control the N-type first switching transistor T1 to be turned on.

Alternatively, in specific implementation, in the embodiment of the present disclosure, when the effective pulse signal of the input signal terminal is a low-level signal, the signal of the first reference signal terminal is a low-level signal, the signal of the second reference signal terminal is a high-level signal, and the signal of the third reference signal terminal is a high-level signal. Of course, this needs to be determined through designing according to the actual application environment, and is not limited herein.

In specific implementation, in the embodiment of the present disclosure, an N-type switching transistor is turned on under the action of a high-level signal and is cut off under the action of a low-level signal; and a P-type switching transistor is turned on under the action of a low-level signal and is cut off under the action of a high-level signal. In specific implementation, based on the type of a transistor, a first electrode of the transistor can be used as a source and a second electrode thereof can be used as a drain, or the first electrode of the transistor can be used as a drain and the second electrode thereof can be used as a source. They are not differentiated specifically herein. In the following description of the specific embodiment, all switching transistors being N-type thin film transistors are used as an example for description.

It should be noted that level signals of the signals mentioned in the embodiment of the present disclosure only represent their logic level signals, and are not values of voltages actually applied of the signals during specific implementation. The specific voltage values of the aforementioned signals can be determined through designing according to the actual application environment, and are not limited herein.

It should be noted that the switching transistors in the aforementioned embodiment of the present disclosure may be thin film transistors (TFTs), and may also be metal oxide semiconductor field effect transistors (MOSFETs), and are not limited herein.

Correspondingly, an embodiment of the present disclosure further provides a driving method for the aforementioned shift register, as shown in FIG. 3, which can specifically include the following steps:

S301, in a first phase, providing, by the input circuit, the signal of the first reference signal terminal to the first node in response to the signal of the input signal terminal; controlling, by the first control circuit, the signal of the second node in response to the signal of the input signal terminal; controlling, by the second control circuit, the signal of the third node in response to the signal of the first node; and providing, by the output circuit, the signal of the clock signal terminal to the output signal terminal in response to the signal of the first node;

S302, providing, by the output circuit, the signal of the clock signal terminal to the output signal terminal in response to the signal of the first node; controlling, by the first control circuit, the signal of the second node in response to the signal of the clock signal terminal; and controlling, by the second control circuit, the signal of the third node in response to the signal of the first node; and S303, providing, by the output circuit, the signal of the clock signal terminal to the output signal terminal in response to the signal of the first node, and providing the signal of the second reference signal terminal to the output signal terminal in response to the signal of the third node.

To better understand the technical solution of the present disclosure, a specific working process of the shift register provided in the present disclosure will be described in detail below by using the structure of the shift register shown in FIG. 2 as an example.

Figure 4:
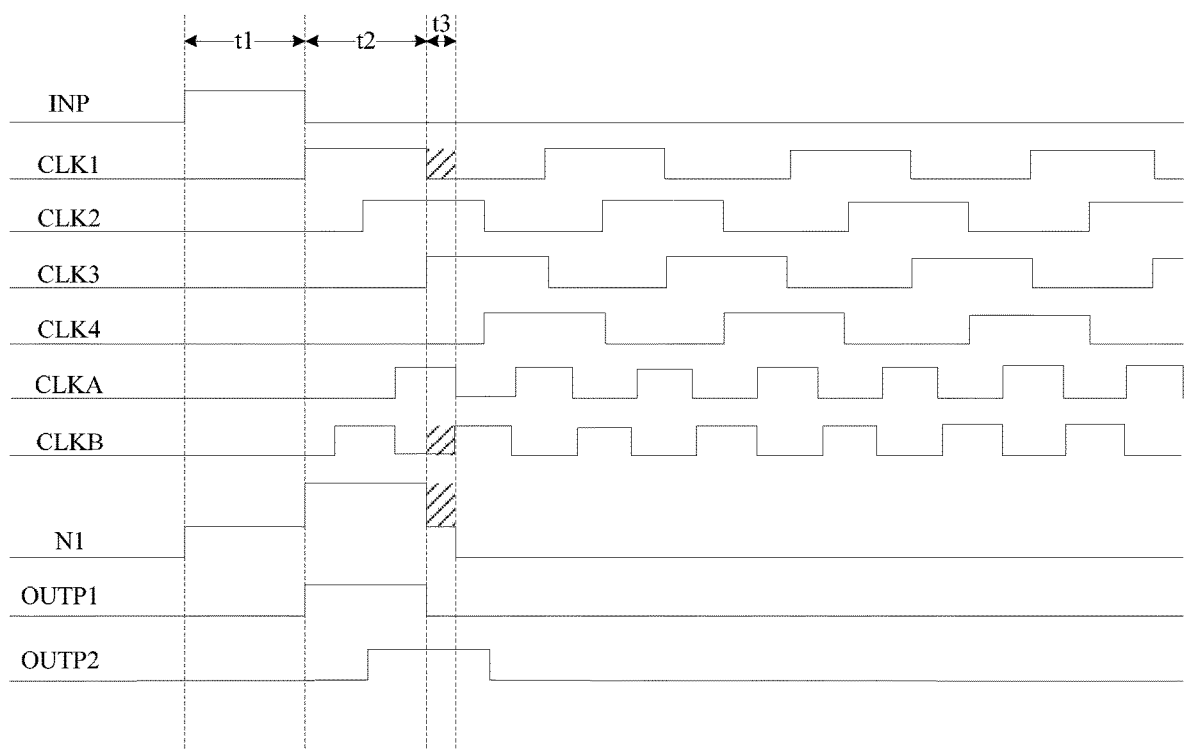
FIG. 4 is a circuit timing diagram of the shift register shown in FIG. 2.

In the shift register shown in FIG. 2, all the switching transistors are N-type transistors, and each N-type transistor is turned on under the action of the high-level signal and cut off under the action of the low-level signal; and in FIG. 2, the first reference signal terminal VGH outputs a high-level signal, the third reference signal terminal VSSL outputs a low-level signal, the second reference signal terminal VSS outputs a low-level signal, and a voltage value of the low-level signal output from the third reference signal terminal VSSL and a voltage value of the low-level signal output from the second reference signal terminal VSS are different. A corresponding work timing diagram is shown in FIG. 4. Specifically, a first phase t1, a second phase t2, and a third phase t3 in the work timing diagram shown in FIG. 4 are selected as an example for detailed description. A working process of a stage of shift register is described, where CLK1 represents a signal input to the clock signal terminal CLK of the present stage of shift register; CLKA represents a signal input to the first control clock signal terminal CLKA of the present stage of shift register; CLKB represents a signal input to the second control clock signal terminal CLKB of the present stage of shift register; OUTP1 represents a signal output from the output signal terminal OUTP of the present stage of shift register; and OUTP2 represents a signal output from the output signal terminal OUTP of the next stage of shift register cascaded with the present stage of shift register.

The first phase t1: the input signal terminal INP outputs a high-level signal, the clock signal terminal CLK outputs a low-level signal, the first control clock signal terminal CLKA outputs a low-level signal, and the second control clock signal terminal CLKB outputs a low-level signal.

The first switching transistor T1 is turned on under the action of the high-level signal of the input signal terminal INP, and the high-level signal of the first reference signal terminal VGH is input to the first node N1 through the turned-on first switching transistor T1, so that the fifth switching transistor T5 is turned on under the action of the high-level signal of the first node N1, and the low-level signal of the third reference signal terminal VSSL is input to the third node N3 through the turned-on fifth switching transistor T5. The sixth switching transistor T6 is in a cut-off state under the action of the low-level signal of the third node N3, thereby preventing the second reference signal terminal VSS from pulling down the level signal of the output signal terminal OUTP, and further preventing the level signal of the first node N1 from being pulled down due to the coupling effect of the capacitor C, thus avoiding electrical leakage of the first node N1 through the sixth switching transistor T6, and ensuring the stability of the level signal of the first node N1.

In addition, the ninth switching transistor T9 is turned on under the action of the high-level signal of the input signal terminal INP, and the low-level signal of the third reference signal terminal VSSL is input to the second node N2 through the turned-on ninth switching transistor T9, so that the seventh switching transistor T7 is in a cut-off state under the action of the low-level signal of the second node N2, thereby preventing a voltage of the second reference signal terminal VSS from being input to the first node N1, preventing the first node N1 from electrical leakage through the seventh switching transistor T7, and ensuring the stability of the level signal of the first node N1.

Furthermore, the second switching transistor T2 is turned on under the action of the high-level signal of the first node N1, and the low-level signal of the clock signal terminal CLK can be provided to the output signal terminal OUTP, so that the output signal terminal OUTP outputs a low-level signal.

The second phase t2: the input signal terminal INP outputs a low-level signal, the clock signal terminal CLK outputs a high-level signal, and the first control clock signal terminal CLKA and the second control clock signal terminal CLKB alternately output high-level signals.

The first switching transistor T1 is in a cut-off state under the control of the low-level signal of the input signal terminal INP. Due to the effect of the capacitor C, the level signal of the first node N1 can be maintained to be a high-level signal after the end of the first phase t1, so that the second switching transistor T2 is in an on state. The high-level signal of the clock signal terminal CLK is input to the output signal terminal OUTP through the turned-on second switching transistor T2. Due to the coupling effect of the first capacitor C, the level signal of the first node N1 is further raised, and the second switching transistor T2 is turned on more fully, thereby ensuring that the high-level signal of the clock signal terminal CLK can be input to the output signal terminal OUTP without voltage loss as much as possible, that is, ensuring that the high-level signal of the clock signal CLK can be output stably.

Furthermore, as the level signal of the first node N1 is further raised, the fifth switching transistor T5 can be turned on under the action of the high-level signal of the first node N1, and the low-level signal of the third reference signal terminal VSSL is input to the third node N3 through the turned-on fifth switching transistor T5. Furthermore, as the first control clock signal terminal CLKA and the second control clock signal terminal CLKB alternately output high-level signals, the third switching transistor T3 and the fourth switching transistor T4 are alternately turned on, so that the level signal of the third node N3 is the high-level signal of the first control clock signal terminal CLKA or the high-level signal of the second control clock signal terminal CLKB. However, as the width-to-length ratio of the fifth switching transistor T5 is greater than that of the third switching transistor T3 and that of the fourth switching transistor T4, therefore the level signal of the third node N3 is maintained to be the low-level signal of the third reference signal terminal VSSL in the second phase t2, so that the sixth switching transistor T6 is in a cut-off state under the action of the low-level signal of the third node N3, thereby preventing the second reference signal terminal VSS from pulling down the level signal of the output signal terminal OUTP, and ensuring the stable output of the signal of the output signal terminal OUTP.

In addition, when the second control clock signal terminal CLKB outputs a high-level signal, the eighth switching transistor T8 is turned on under the action of the high-level signal of the second control clock signal terminal CLKB, so that the high-level signal of the second control clock signal terminal CLKB is input to the first node N1; and the tenth switching transistor T10 is turned on under the action of the high-level signal of the clock signal terminal CLK, and the low-level signal of the third reference signal terminal VSSL is input to the first node N1 through the turned-on tenth switching transistor T10. As the width-to-length ratio of the tenth switching transistor T10 is greater than that of the eighth switching transistor T8, the level signal of the first node N1 is maintained to be the low-level signal of the third reference signal terminal VSSL, and the seventh switching transistor T7 is always in a cut-off state under the action of the low-level signal of the first node N1, and does not influence the level signal of the first node N1.

The third phase t3: the input signal terminal INP outputs a low-level signal, the clock signal terminal CLK outputs a low-level signal, the first control clock signal terminal CLKA outputs a high-level signal, and the second control clock signal terminal CLKB outputs a low-level signal.

The first switching transistor T1 is in a cut-off state under the control of the low-level signal of the input signal terminal INP. The third switching transistor T3 is in an on state under the action of the high-level signal of the first control clock signal terminal CLKA, and the high-level signal of the first control clock signal terminal CLKA is input to the third node N3 through the turned-on third switching transistor T3. The sixth switching transistor T6 is turned on under the action of the high-level signal of the third node N3, so that the second reference signal terminal VSS pulls down the level signal of the output signal terminal OUTP, and at the time, the level signal of the first node N1 is lowered (a boss corresponding to a shaded portion of the first node N1 as shown in FIG. 4) due to the coupling effect of the capacitor C, but the second switching transistor T2 can still be kept in an on state, so that the level signal of the output signal terminal OUTP is further pulled down by the clock signal terminal CLK. In this way, under the pull-down effect of the low-level signal of the clock signal terminal CLK and the low-level signal of the second reference signal terminal VSS together, the level signal of the output signal terminal OUTP can be pulled down quickly, so that the falling edge time of the level signal of the output signal terminal OUTP is greatly reduced, that is, the pull-down time of the gate output is shorter.

In addition, if the second control clock signal terminal CLKB outputs a high-level signal instead of a low-level signal in the third phase t3, the eighth switching transistor T8 can be turned on under the action of the high-level signal of the second control clock signal terminal CLKB, and the high-level signal of the second control clock signal terminal CLKB is input to the first node N1, such that the seventh switching transistor T7 is turned on under the action of the first node N1, and the second reference signal terminal VSS can pull down the level signal of the first node N1, such that the second switching transistor T2 is cut off, which can prevent the low-level signal of the clock signal terminal CLK from being input to the output signal terminal OUTP. Only using the second reference signal terminal VSS to pull down the level signal of the output signal terminal OUTP can cause the pull-down time of the output signal terminal OUTP to be longer, as compared with using the clock signal terminal CLK and the second reference signal terminal VSS together to pull down the level signal of the output signal terminal OUTP described above. Therefore, to achieve the technical effect of pulling down the level signal of the output signal terminal OUTP by the clock signal terminal CLK and the second reference signal terminal VSS together, the second control clock signal terminal CLKB must output a low-level signal in the phase. That is, in the third phase t3, after the level signal of the clock signal terminal CLK becomes a low-level signal, the level signal of the second control clock signal terminal CLKB shall also be a low-level signal, and after the end of the third phase t3, the second control clock signal terminal CLKB can be changed into a high-level signal. In other words, the high-level signal of the second control clock signal terminal CLKB shall arrive in a delayed mode relative to the low-level signal of the clock signal terminal CLK, so as to pull down the level signal of the output signal terminal OUTP quickly under the action of the clock signal terminal CLK and the second reference signal terminal VSS together.

It can be seen from the above description that in the aforementioned shift register provided in the embodiment of the present disclosure, the pull-down time of the output signal terminal OUTP can be greatly shortened under the pull-down effect of the low-level signal of the clock signal terminal CLK and the low-level signal of the second reference signal terminal VSS together, thus reducing the influence of the present stage of shift register on the subsequent shift register connected with its output signal terminal OUTP, and ensuring the charging rate of corresponding pixels by the subsequent shift register, thereby improving the abnormal screen display.

Figure 5:
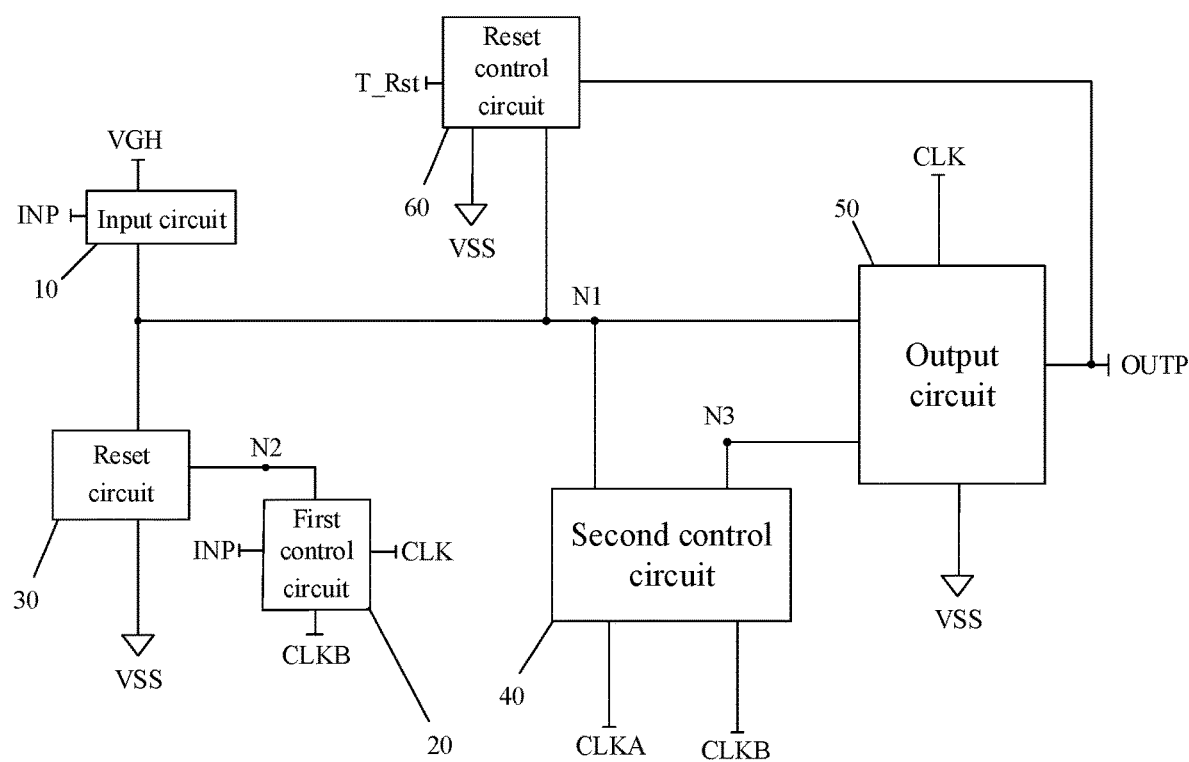
FIG. 5 is a structural schematic diagram of other shift registers provided in an embodiment of the present disclosure.

An embodiment of the present disclosure also provides some shift registers. As shown in FIG. 5, compared with the aforementioned shift registers, the shift register provided in the embodiment is only additionally provided with a reset control circuit 60, so only the reset control circuit 60 is described in detail below, and similarities to the aforementioned embodiment will not be repeated.

In specific implementation, in the embodiment of the present disclosure, the reset control circuit 60 is configured to provide a signal of the second reference signal terminal VSS to the first node N1 and the output signal terminal OUTP respectively in response to a signal of the reset signal terminal T_Rst. The reset control circuit 60 is coupled to the reset signal terminal T_Rst, the first node N1, the output signal terminal OUTP, and the second reference signal terminal VSS respectively.

Figure 6:
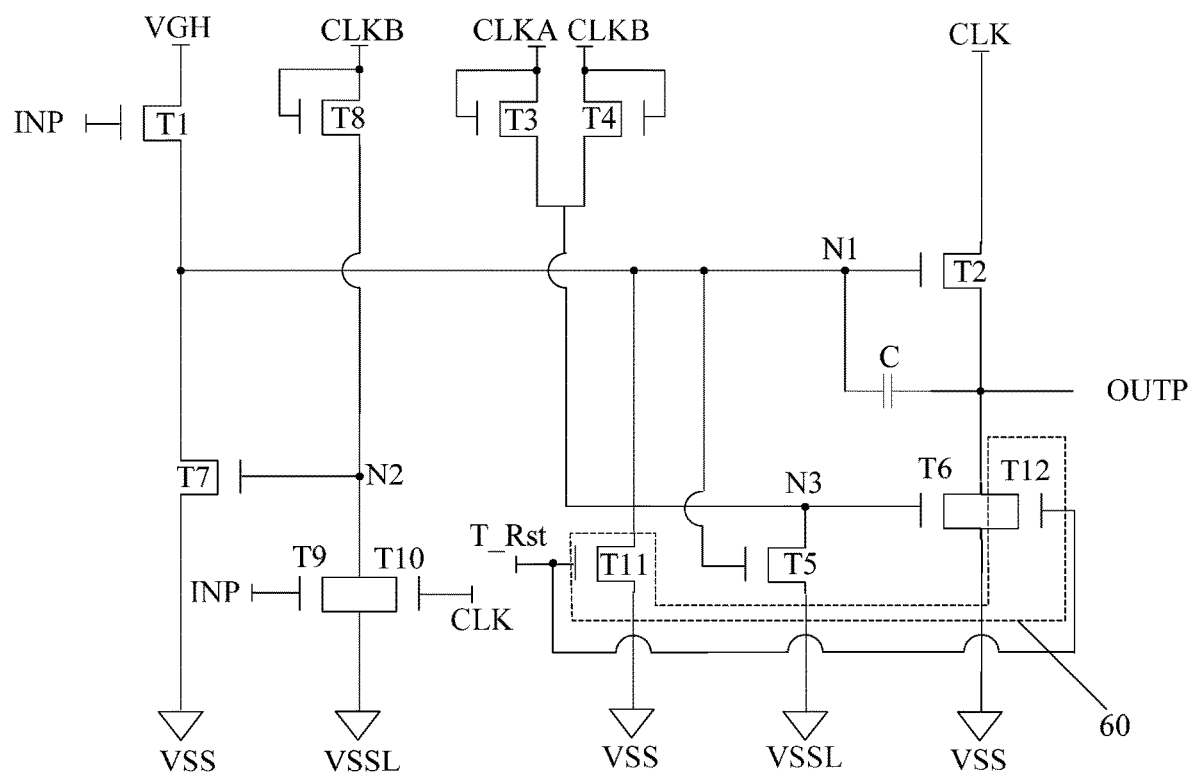
FIG. 6 is a schematic diagram of some specific structures of the shift register shown in FIG. 5.

In specific implementation, as shown in FIG. 6, the reset control circuit 60 can include: an eleventh switching transistor T11 and a twelfth switching transistor T12;

where a gate of the eleventh switching transistor T11 is coupled to the reset signal terminal T_Rst, a first electrode of the eleventh switching transistor T11 is coupled to the second reference signal terminal VSS, and a second electrode of the eleventh switching transistor T11 is coupled to the first node N1; and a gate of the twelfth switching transistor T12 is coupled to the reset signal terminal T_Rst, a first electrode of the twelfth switching transistor T12 is coupled to the second reference signal terminal VSS, and a second electrode of the twelfth switching transistor T12 is coupled to the output signal terminal OUTP.

Exemplarily described above is only a specific structure of the reset control circuit 60 in the shift register provided in the embodiment of the present disclosure. In specific implementation, the specific structure of the reset control circuit 60 is not limited to the aforementioned structure provided in the specific embodiment of the present disclosure, and may further be other structures known to those skilled in the art, and is not limited herein.

It should be noted that the eleventh switching transistor T11 and the twelfth switching transistor T12 mentioned in the aforementioned embodiment of the present disclosure may be TFTs, and may also be MOSFETs, and are not limited here. In specific implementation, based on the type of a transistor, a first electrode of the transistor can be used as a source and a second electrode thereof can be used as a drain, or the first electrode of the transistor can be used as a drain and the second electrode thereof can be used as a source. They are not differentiated specifically herein.

Generally, when the switching transistor is a P-type transistor, the first electrode is a source and the second electrode is a drain; and when the switching transistor is an N-type transistor, the first electrode is a drain and the second electrode is a source. In the following description of the specific embodiment, all switching transistors being N-type thin film transistors are used as an example for description.

Figure 7:
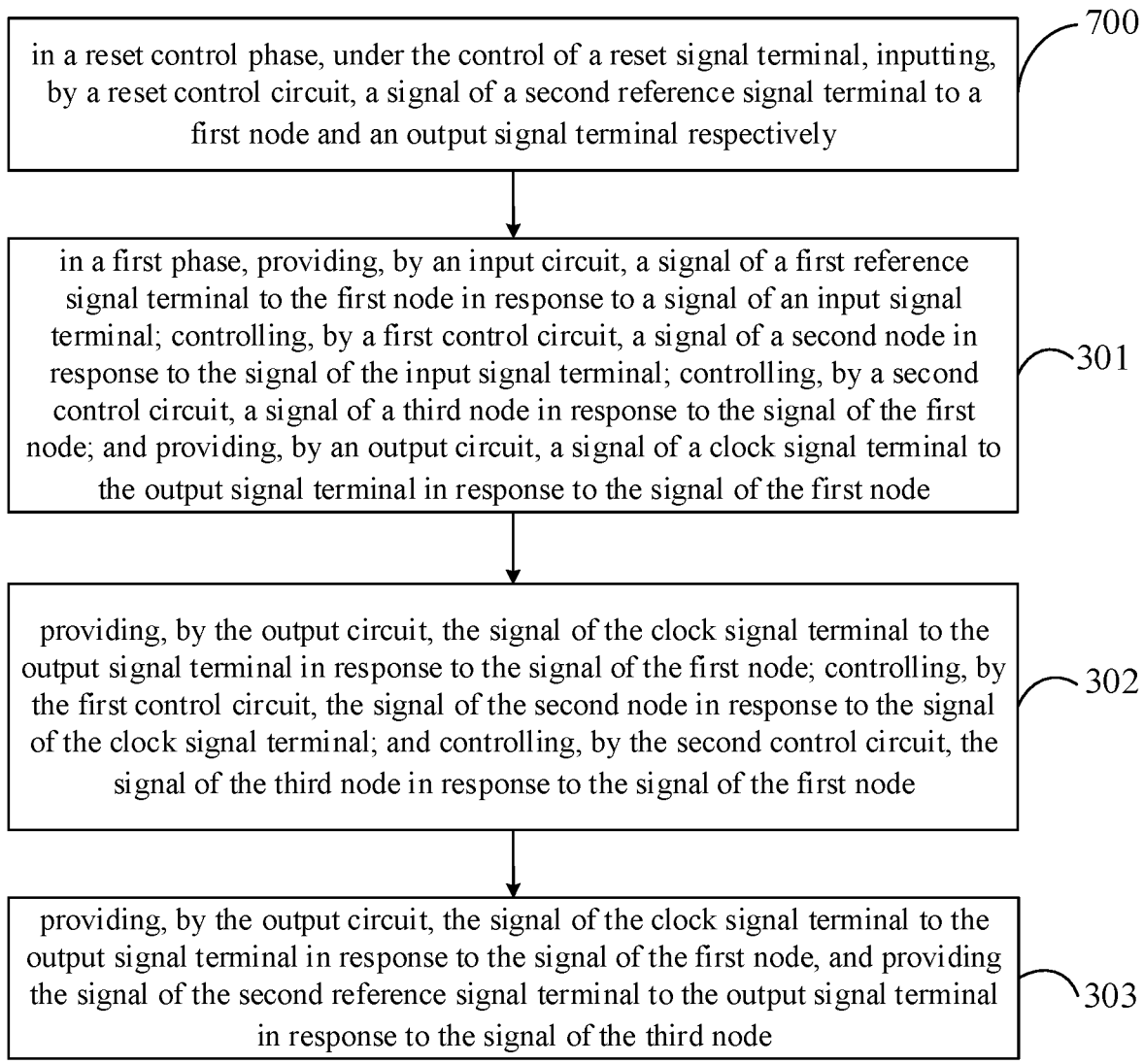
FIG. 7 is a flow diagram of a driving method for the shift register shown in FIG. 6.

In specific implementation, with reference to FIGS. 3 and 7, a specific working process of the shift register provided in the embodiment shown in FIG. 6 has an additional reset control step S700, as compared with the shift register provided in the embodiment shown in FIG. 2.

Specifically, S700 is a reset control phase, in which under the control of the reset signal terminal, the reset control circuit inputs the signal of the second reference signal terminal to the first node and the output signal terminal respectively. That is, before a frame is displayed, the first node N1 and the output signal terminal OUTP are reset by the reset control circuit 60 firstly to avoid subsequent display abnormalities.

It can be understood that the reset control circuit 60 only operates in the reset control phase, and does not operate in the first phase t1, the second phase t2, and the third phase t3.

Figure 8:
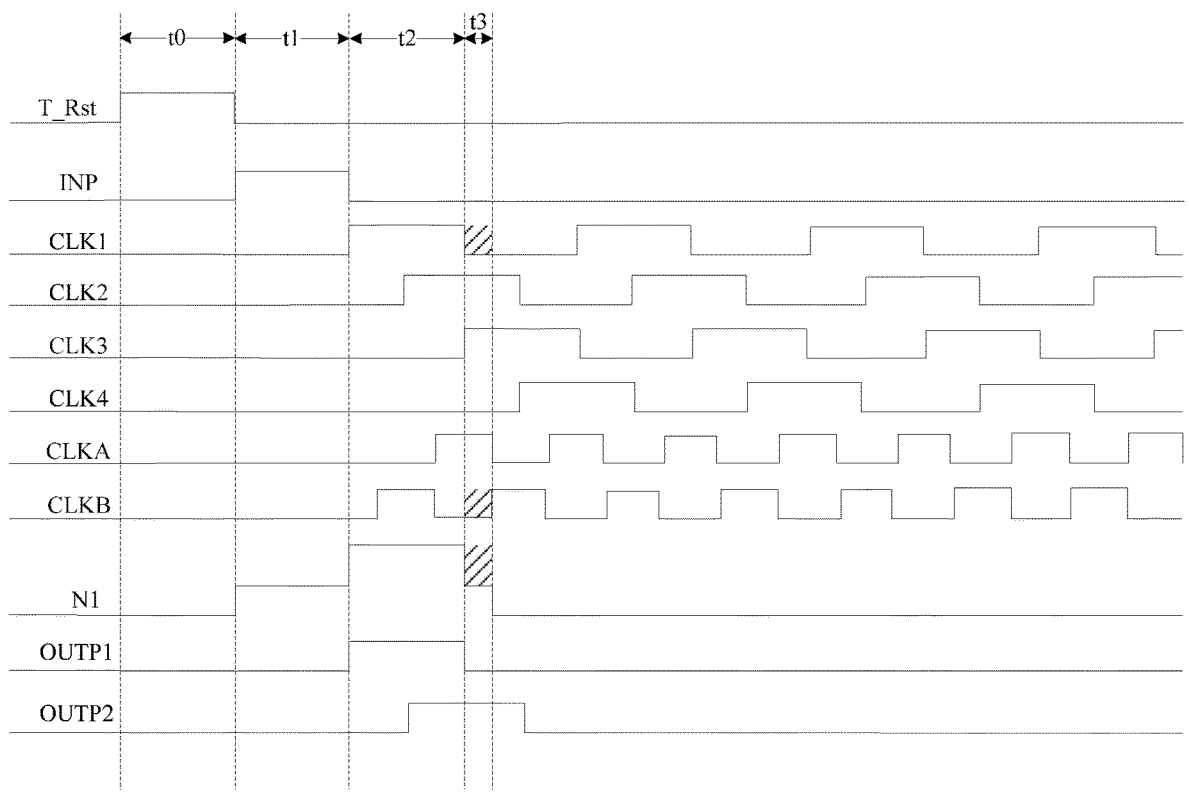
FIG. 8 is a circuit timing diagram of the shift register shown in FIG. 6.

Specifically, the eleventh switching transistor T11 and the twelfth switching transistor T12 included in the reset control circuit 60 shown in FIG. 6 and being both N-type transistors that are turned on under the action of a high-level signal and cut off under the action of a low-level signal are used as an example. As shown in FIG. 8, in the reset control phase t0, the reset signal terminal T_Rst outputs a high-level signal, the eleventh switching transistor T11 is turned on under the action of the high-level signal of the reset signal terminal T_Rst, and a low-level signal of the second reference signal terminal VSS is input to the first node N1 through the turned-on eleventh switching transistor T11 to reset the first node N1. Meanwhile, the twelfth switching transistor T12 is turned on under the action of the high-level signal of the reset signal terminal T_Rst, and the low-level signal of the second reference signal terminal VSS is input to the output signal terminal OUTP through the turned-on twelfth switching transistor T12 to reset the output signal terminal OUTP.

In the first phase t1, the second phase t2, and the third phase t3, the reset signal terminal T_Rst outputs a low-level signal respectively, and the eleventh switching transistor T11 and the twelfth switching transistor T12 are both in a cut-off state. Furthermore, the working process of the shift register shown in FIG. 7 in the first phase t1, the second phase t2, and the third phase t3 can be substantially similar to that of the shift register shown in FIG. 2 in the first phase t1, the second phase t2, and the third phase t3, and will not be repeated here.

Notably, based on the same principle as the shift register provided in the aforementioned embodiment, the shift register provided in the embodiment of the present disclosure can also achieve the technical effect of reducing the pull-down time of the output signal terminal OUTP, thereby avoiding abnormal screen display.

Figure 9:
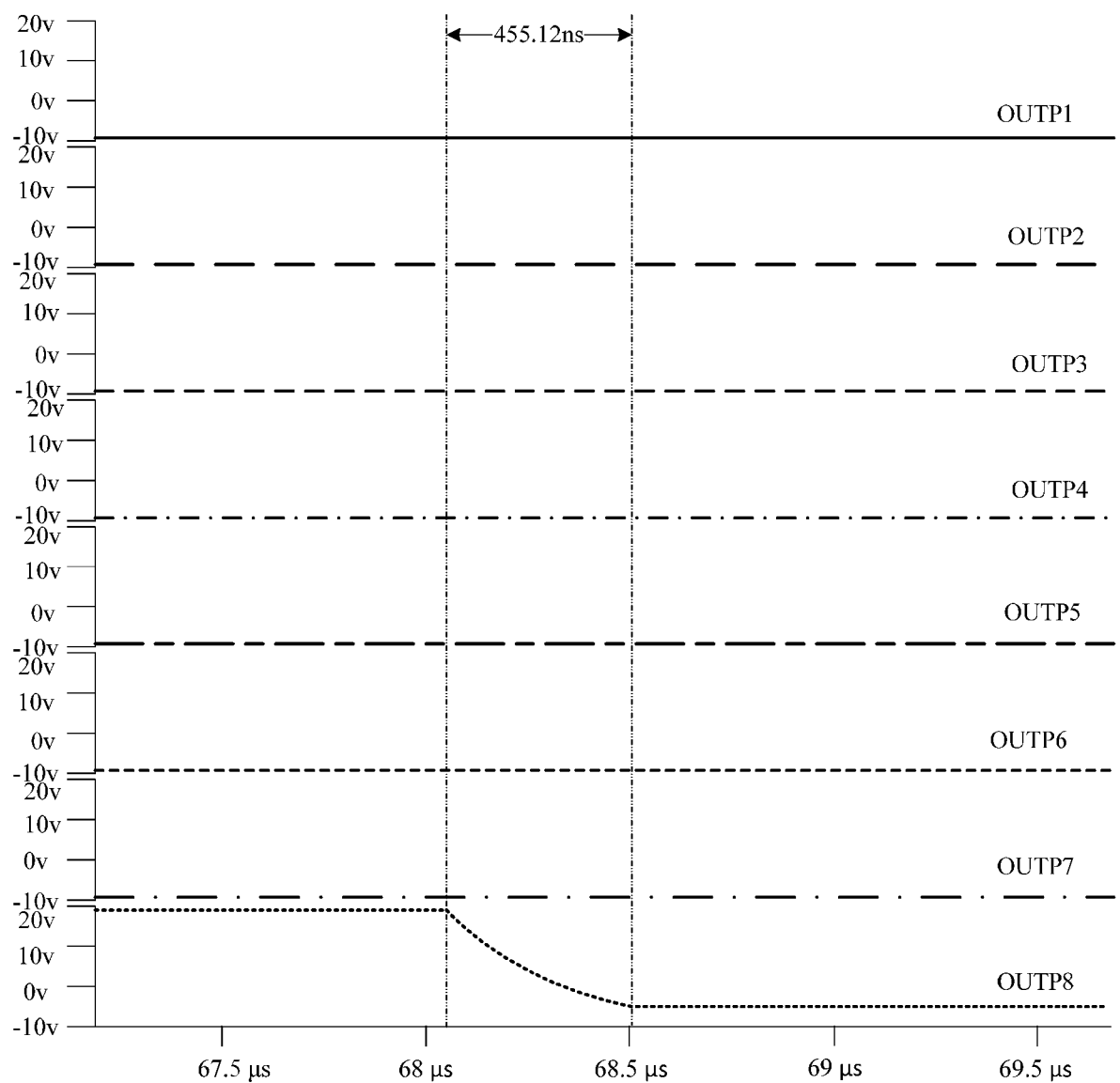
FIG. 9 is a first schematic diagram of level signal changes at an output signal terminal of a shift register provided in an embodiment of the present disclosure.
Figure 10:
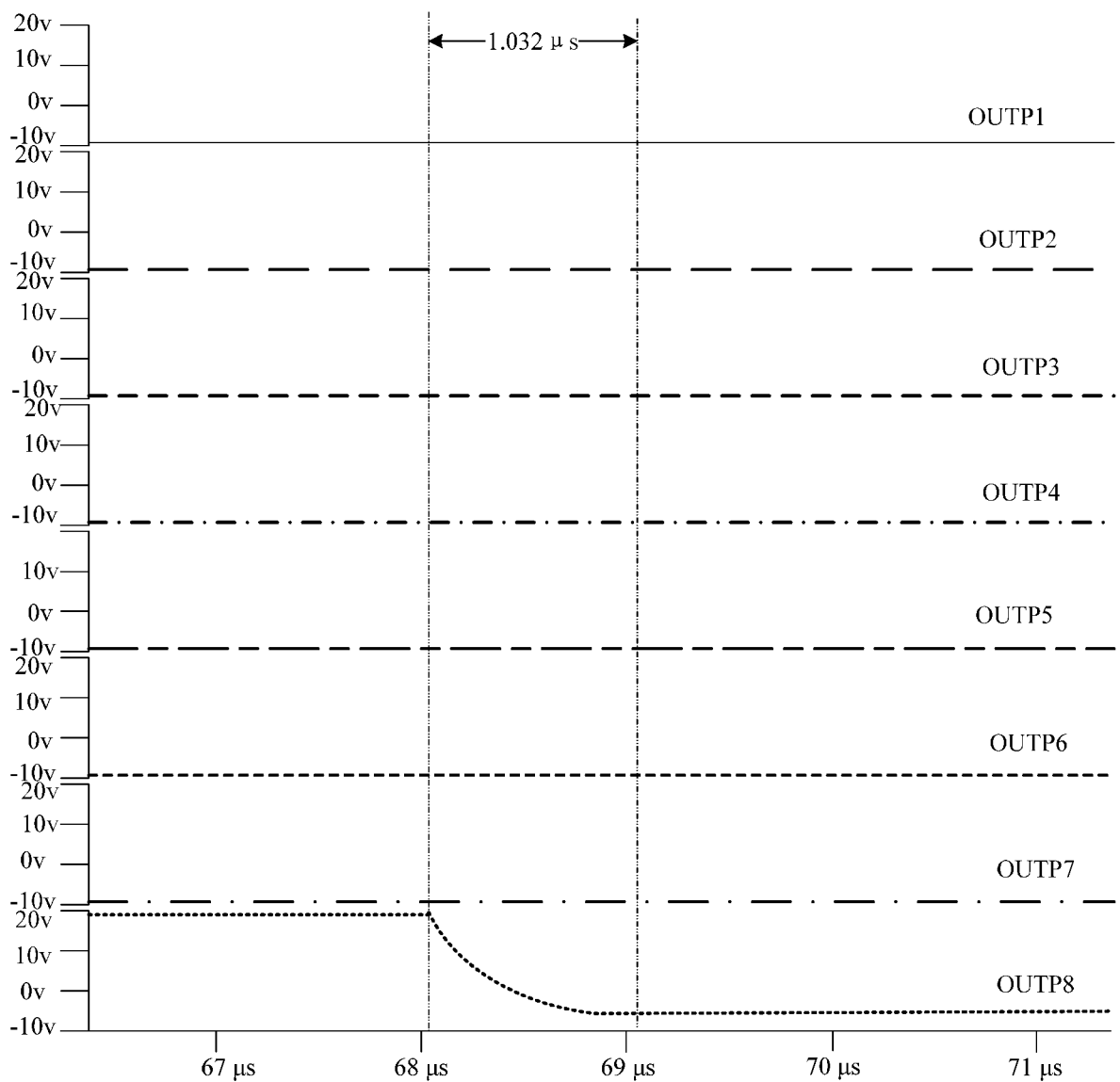
FIG. 10 is a second schematic diagram of level signal changes at an output signal terminal of a shift register provided in an embodiment of the present disclosure.

Furthermore, to verify the above conclusion, a set of comparative tests are performed in the present disclosure, and the results are shown in FIGS. 9 and 10. FIG. 9 shows a schematic diagram of a pull-down process of the output signal terminal OUTP under the condition that the high-level signal of the second control clock signal terminal CLKB arrives in a mode of being delayed by 1 μs after the clock signal terminal CLK has a low-level signal. FIG. 10 is a schematic diagram of a pull-down process of the output signal terminal OUTP under the condition that the second control clock signal terminal CLKB has a high-level signal while the clock signal terminal CLK has a low-level signal. Furthermore, in FIGS. 9 and 10, the abscissa represents time, and the ordinate represents voltage. Generally, the time required by the output signal terminal of a prior stage of shift register being fully pulled down is shorter than the time required by the output signal terminal of a next stage of shift register being fully pulled down. Thus, to better verify the effect, FIGS. 9 and 10 only show pull-down processes of an output signal terminal OUTP8 of an eighth-stage shift register. Comparison between FIGS. 9 and 10 can show that the falling edge time of the output signal terminal OUTP8 of the eighth-stage shift register in FIG. 10 is 1.032 μs, and the falling edge time of the output signal terminal OUTP8 of the eighth-stage shift register in FIG. 9 is only 455.12 ns, and the time required by the output signal terminal OUTP8 of the eighth-stage shift register being completely pulled down is greatly reduced.

Based on the same inventive concept, embodiments of the present disclosure further provide some gate drive circuits. As the problem-solving principle of the gate drive circuit is similar to that of the aforementioned shift register, thus the implementation of the gate drive circuit provided in the embodiment of the present disclosure can refer to the implementation of the aforementioned shift register provided in the embodiment of the present disclosure, and similarities will not be repeated.

Specifically, the gate drive circuit provided in the embodiment of the present disclosure includes a plurality of cascaded shift registers, where an input signal terminal of a first stage of shift register is coupled to a first frame trigger signal terminal; an input signal terminal of a second stage of shift register is coupled to a second frame trigger signal terminal; and in every three adjacent stages of shift registers, an input signal terminal of the third shift register is coupled to an output signal terminal of the first shift register. That is, except for the first stage of shift register and the second stage of shift register, an input signal terminal of each of the rest of stages of the shift registers is respectively coupled to an output signal terminal of a previous spaced stage of shift register.

Figure 11:
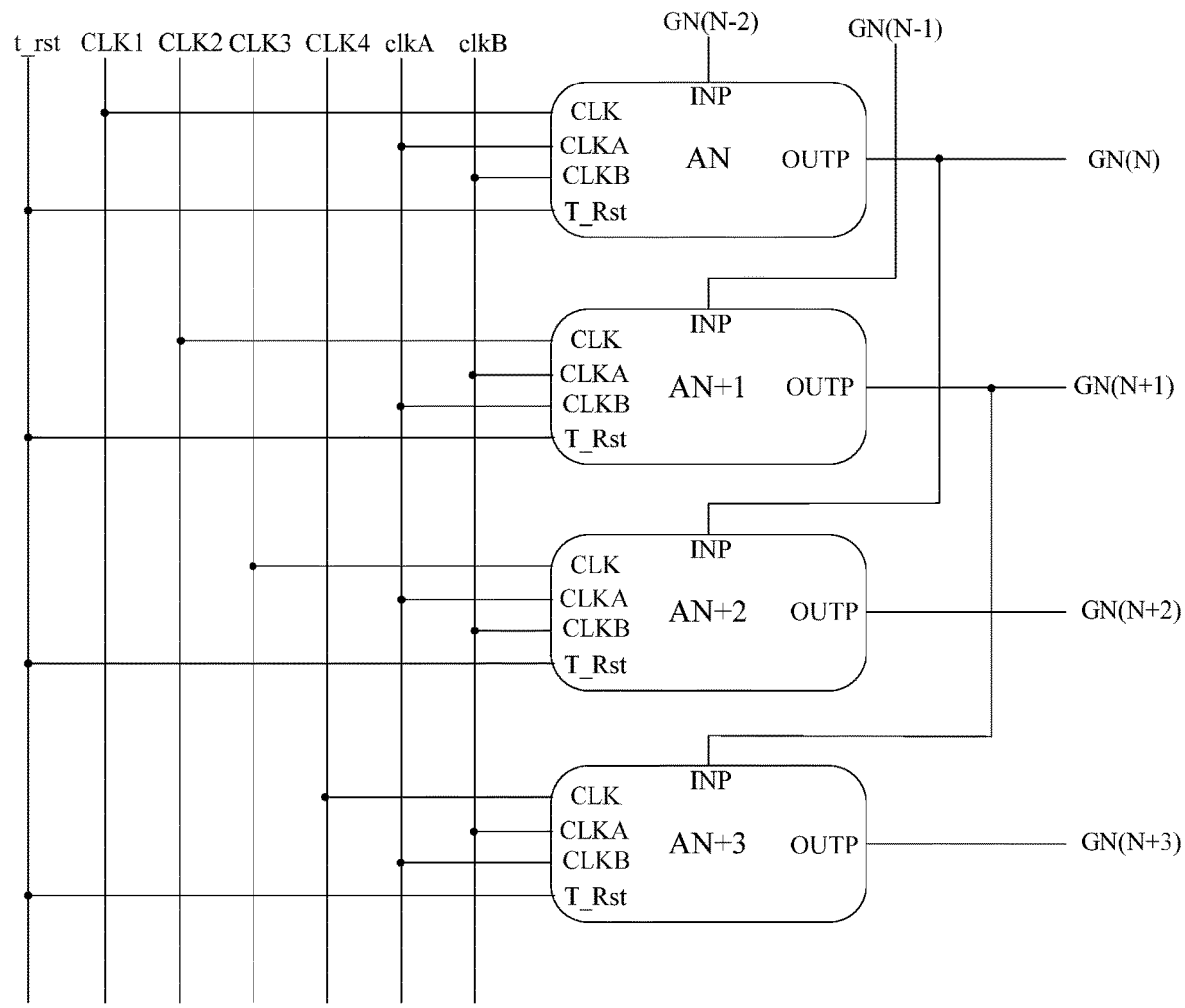
FIG. 11 is a structural schematic diagram of some gate drive circuits provided in an embodiment of the present disclosure.

For example, as shown in FIG. 11, the gate drive circuit provided in the embodiment of the present disclosure including the shift register shown in FIG. 5 is used as an example, and FIG. 11 only shows a connection diagram of an $N^{th}$ stage of shift register AN to an $(N+3)^{th}$ stage of shift register AN+3, where N is an integer greater than or equal to 3. It can be seen that an input signal terminal INP of the $N^{th}$ stage of shift register AN is coupled to an output signal terminal OUTP of a previous spaced stage of shift register (i.e. an $(N-2)^{th}$ stage of shift register) to receive an output signal GN (N-2). An input signal terminal INP of an $(N+1)^{th}$ stage of shift register AN+1 is coupled to an output signal terminal OUTP of a previous spaced stage of shift register (i.e. an $(N-1)^{th}$ stage of shift register) to receive an output signal GN (N-1). An input signal terminal INP of an $(N+2)^{th}$ stage of shift register AN+2 is coupled to an output signal terminal OUTP of a previous spaced stage of shift register (i.e. the $N^{th}$ stage of shift register AN) to receive an output signal GN (N). An input signal terminal INP of the $(N+3)^{th}$ stage of shift register AN+3 is coupled to an output signal terminal OUTP of a previous spaced stage of shift register (i.e. the $(N+1)^{th}$ stage of shift register AN+1) to receive an output signal GN (N+1).

Furthermore, to ensure that the capacitor C in the shift register is fully charged, four clock signals are used in the gate drive circuit provided in the embodiment of the present disclosure, and the timing of adjacent clock signals has a 50% overlap. Specifically, as shown in FIGS. 4 and 8, the four clock signals are a first clock signal CLK1, a second clock signal CLK2, a third clock signal CLK3 and a fourth clock signal CLK4 respectively, and there is a 50% overlap between the working timing of the first clock signal CLK1 and the working timing of the second clock signal CLK2, a 50% overlap between the working timing of the second clock signal CLK2 and the working timing of the third clock signal CLK3, and a 50% overlap between the working timing of the third clock signal CLK3 and the working timing of the fourth clock signal CLK4. Exemplarily, a signal of a clock signal terminal CLK of an $(4k-3)^{th}$ stage of shift register is provided by the first clock signal CLK1; a signal of a clock signal terminal CLK of a $(4k-2)^{th}$ stage of shift register is provided by the second clock signal CLK2; a signal of a clock signal terminal CLK of a $(4k-1)^{th}$ stage of shift register is provided by the third clock signal CLK3; and a signal of a clock signal terminal CLK of a 4kth stage of shift register is provided by the fourth clock signal CLK4, where k is a positive integer.

Furthermore, a signal of a first control clock signal terminal CLKA of a $(2m-1)^{th}$ stage of shift register and a signal of a second control clock signal terminal CLKB of a 2mth stage of shift register are both provided by a first control clock signal clkA. A signal of a second control clock signal terminal CLKB of the $(2m-1)^{th}$ stage of shift register and a signal of a first control clock signal terminal CLKA of the 2mth stage of shift register are both provided by a second control clock signal clkB, where m is a positive integer.

Figure 12:
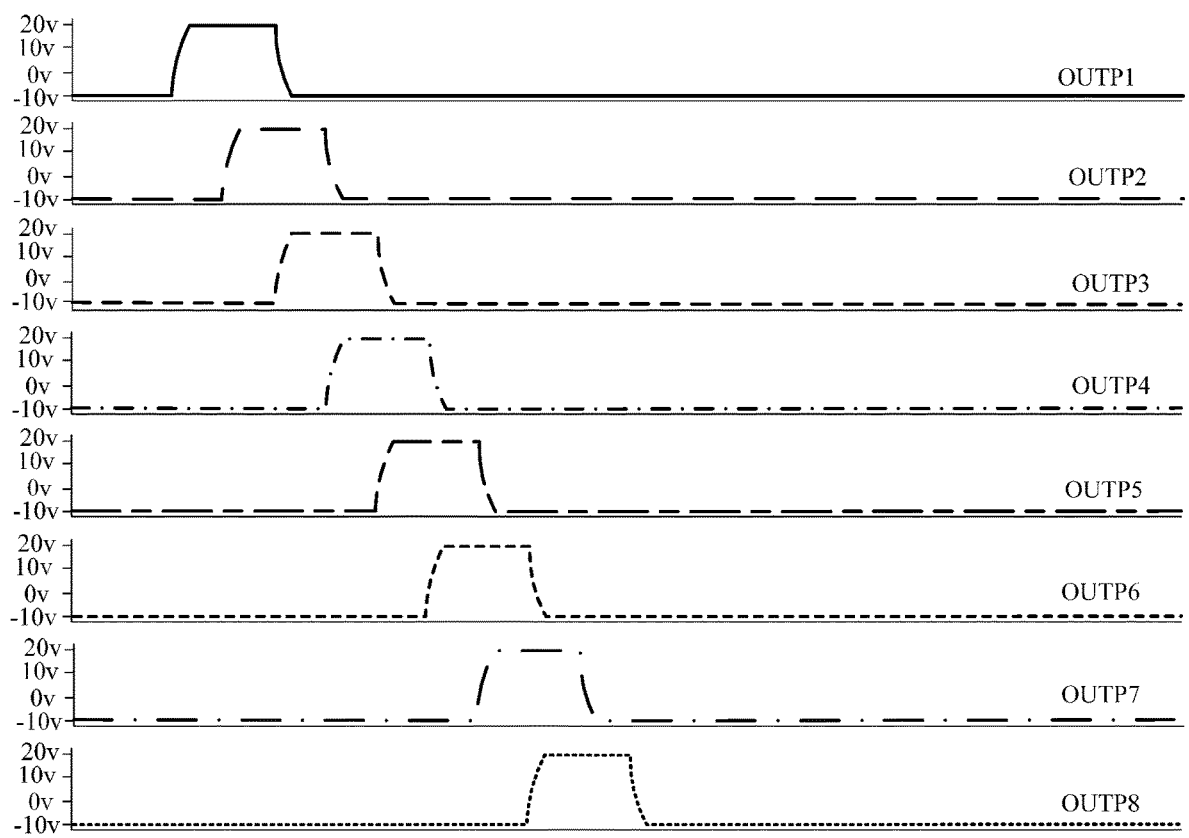
FIG. 12 is a timing diagram of stage driving simulation from the first-stage to eighth-stage shift registers in the gate drive circuit shown in FIG. 11.

In addition, the present disclosure further implements stage driving simulation on the gate drive circuit shown in FIG. 11, and results are shown in FIG. 12. Specifically, FIG. 12 only shows a stage-by-stage shift process from the first-stage shift register to the eighth-stage shift register.

Based on the same inventive concept, an embodiment of the present disclosure further provides a display device including the aforementioned gate drive circuit provided in an embodiment of the present disclosure. For implementation of the display device, reference can be made to the embodiment of the aforementioned gate drive circuit, and similarities will not be repeated.

In specific implementation, the display device mentioned in the embodiment of the present disclosure may be any product or component with a display function, such as a mobile phone, a tablet computer, a television, a display, a notebook computer, a digital camera, a navigator, a smart watch, a fitness wristband, a personal digital assistant, or an automatic deposit/teller machine. Other indispensable components of the display device are present as understandable by those skilled in the art, and are not repeated herein, nor should they be construed as limiting the present disclosure.

The preferred embodiments of the present disclosure are described above; however, once those skilled in the art get the basic inventive concepts, they can make additional variations and modifications to the embodiments. Therefore, the appended claims are intended to be interpreted as including the preferred embodiments and all variations and modifications falling into the scope of the present disclosure.

Apparently, those skilled in the art can make changes and modifications to the embodiments of the present disclosure without departing from the spirit and scope of the present disclosure. Thus, the present disclosure is also intended to encompass the changes and modifications if such changes and modifications of the embodiments of the present disclosure fall within the scope of the claims of the present disclosure and equivalents thereof.

What is claimed is:

1. A shift register, comprising:
an input circuit, configured to provide a signal of a first reference signal terminal to a first node in response to a signal of an input signal terminal;
a first control circuit, configured to control a signal of a second node in response to signals of the input signal terminal, a clock signal terminal and a second control clock signal terminal;
a reset circuit, configured to provide a signal of a second reference signal terminal to the first node in response to the signal of the second node;
a second control circuit, configured to control a signal of a third node in response to signals of a first control clock signal terminal, the second control clock signal terminal, and the first node;
an output circuit, configured to provide the signal of the clock signal terminal to an output signal terminal in response to the signal of the first node, and configured to provide the signal of the second reference signal terminal to the output signal terminal in response to the signal of the third node; and
a reset control circuit, configured to provide the signal of the second reference signal terminal to the first node and the output signal terminal respectively in response to a signal of a reset signal terminal;
wherein the reset control circuit comprises: an eleventh switching transistor and a twelfth switching transistor;
a gate of the eleventh switching transistor is coupled to the reset signal terminal, a first electrode of the eleventh switching transistor is coupled to the second reference signal terminal, and a second electrode of the eleventh switching transistor is coupled to the first node; and
a gate of the twelfth switching transistor is coupled to the reset signal terminal, a first electrode of the twelfth switching transistor is coupled to the second reference signal terminal, and a second electrode of the twelfth switching transistor is coupled to the output signal terminal.

2. The shift register according to claim 1, wherein the input circuit comprises a first switching transistor, and
a gate of the first switching transistor is coupled to the input signal terminal, a first electrode of the first switching transistor is coupled to the first reference signal terminal, and a second electrode of the first switching transistor is coupled to the first node.

3. The shift register according to claim 1, wherein the output circuit comprises: a second switching transistor, a sixth switching transistor and a capacitor;
a gate of the second switching transistor is coupled to the first node, a first electrode of the second switching transistor is coupled to the clock signal terminal, and a second electrode of the second switching transistor is coupled to the output signal terminal;
a gate of the sixth switching transistor is coupled to the third node, a first electrode of the sixth switching transistor is coupled to the second reference signal terminal, and a second electrode of the sixth switching transistor is coupled to the output signal terminal; and
the capacitor is coupled between the first node and the output signal terminal.

4. The shift register according to claim 1, wherein the second control circuit comprises: a third switching transistor, a fourth switching transistor and a fifth switching transistor;
a gate and a first electrode of the third switching transistor are coupled to the first control clock signal terminal respectively, and a second electrode of the third switching transistor is coupled to the third node;
a gate and a first electrode of the fourth switching transistor are coupled to the second control clock signal terminal respectively, and a second electrode of the fourth switching transistor is coupled to the third node;
a gate of the fifth switching transistor is coupled to the first node, a first electrode of the fifth switching transistor is coupled to a third reference signal terminal, and a second electrode of the fifth switching transistor is coupled to the third node; and
a width-to-length ratio of the fifth switching transistor is greater than that of the third switching transistor and that of the fourth switching transistor.

5. The shift register according to claim 1, wherein the reset circuit comprises a seventh switching transistor; and
a gate of the seventh switching transistor is coupled to the second node, a first electrode of the seventh switching transistor is coupled to the second reference signal terminal, and a second electrode of the seventh switching transistor is coupled to the first node.

6. The shift register according to claim 1, wherein the first control circuit comprises: an eighth switching transistor, a ninth switching transistor and a tenth switching transistor;
- a gate and a first electrode of the eighth switching transistor are coupled to the second control clock signal terminal respectively, and a second electrode of the eighth switching transistor is coupled to the second node;
- a gate of the ninth switching transistor is coupled to the input signal terminal, a first electrode of the ninth switching transistor is coupled to a third reference signal terminal, and a second electrode of the ninth switching transistor is coupled to the second node;
- a gate of the tenth switching transistor is coupled to the clock signal terminal, a first electrode of the tenth switching transistor is coupled to the third reference signal terminal, and a second electrode of the tenth switching transistor is coupled to the second node; and
- a width-to-length ratio of the eighth switching transistor is smaller than that of the ninth switching transistor and that of the tenth switching transistor.

7. A gate drive circuit, comprising: a plurality of cascaded shift registers according to claim 1, wherein
- an input signal terminal of a first stage of shift register is coupled to a first frame trigger signal terminal;
- an input signal terminal of a second stage of shift register is coupled to a second frame trigger signal terminal; and
- in every three adjacent stages of shift registers, an input signal terminal of a third shift register is coupled to an output signal terminal of a first shift register.

8. A display device, comprising the gate drive circuit according to claim 7.

9. A driving method for the shift register according to claim 1, further comprising:
- in a first phase: providing, by the input circuit, the signal of the first reference signal terminal to the first node in response to the signal of the input signal terminal; controlling, by the first control circuit, the signal of the second node in response to the signal of the input signal terminal; controlling, by the second control circuit, the signal of the third node in response to the signal of the first node; and providing, by the output circuit, the signal of the clock signal terminal to the output signal terminal in response to the signal of the first node;
- in a second phase: providing, by the output circuit, the signal of the clock signal terminal to the output signal terminal in response to the signal of the first node; controlling, by the first control circuit, the signal of the second node in response to the signal of the clock signal terminal; and controlling, by the second control circuit, the signal of the third node in response to the signal of the first node; and
- in a third phase: providing, by the output circuit, the signal of the clock signal terminal to the output signal terminal in response to the signal of the first node, and providing the signal of the second reference signal terminal to the output signal terminal in response to the signal of the third node.

\* \* \* \* \*